United States Patent
You et al.

(10) Patent No.: US 11,553,600 B2
(45) Date of Patent: Jan. 10, 2023

(54) DEVICE FOR MANUFACTURING CONDUCTIVE FILM

(71) Applicant: Samsung Display Co., Ltd., Yongin-si (KR)

(72) Inventors: Jun Woo You, Seongnam-si (KR); Atsushi Nemoto, Suwon-si (KR); Tae Ho Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/997,858

(22) Filed: Aug. 19, 2020

(65) Prior Publication Data

US 2021/0204411 A1 Jul. 1, 2021

(30) Foreign Application Priority Data

Dec. 26, 2019 (KR) ........................ 10-2019-0175526

(51) Int. Cl.
*H05K 3/40* (2006.01)
*H05K 1/11* (2006.01)
*H01L 23/00* (2006.01)

(52) U.S. Cl.
CPC ........... *H05K 3/4007* (2013.01); *H01L 24/14* (2013.01); *H05K 1/118* (2013.01)

(58) Field of Classification Search
CPC ...... H05K 3/4007; H05K 1/118; H05K 3/323; H05K 2201/0257; H05K 2203/0134; B29C 41/006; H01L 24/14; B29K 2995/0013; Y10T 29/49124; Y10T 29/59155; Y10T 29/53204
USPC ........................................... 29/829, 846, 746
See application file for complete search history.

(56) References Cited

U.S. PATENT DOCUMENTS

| | | | | |
|---|---|---|---|---|
| 4,323,525 | A * | 4/1982 | Bornat | A61F 2/06 264/441 |
| 4,738,740 | A * | 4/1988 | Pinchuk | B29C 53/587 156/273.1 |
| 6,326,244 | B1 | 12/2001 | Brooks et al. | |
| 7,374,774 | B2 * | 5/2008 | Bowlin | B29C 41/006 424/423 |
| 10,217,807 | B2 * | 2/2019 | Lee | H01L 24/29 |

FOREIGN PATENT DOCUMENTS

| KR | 10-0666124 | 1/2017 |
|---|---|---|
| KR | 10-2017-0137975 | 12/2017 |
| KR | 10-2019-0090468 | 8/2019 |

* cited by examiner

*Primary Examiner* — Donghai D Nguyen
(74) *Attorney, Agent, or Firm* — H.C. Park & Associates, PLC

(57) ABSTRACT

Provided is a device configured to manufacture a conductive film including a rotating member, a first syringe, and a second syringe. The rotating member rotates about an axis extending in a first direction. The first syringe is disposed over a first portion of the rotating member, and is configured to discharge a first polymer and conductive balls. The second syringe is adjacent to the first syringe, and is configured to discharge a second polymer.

12 Claims, 9 Drawing Sheets

DEVICE FOR MANUFACTURING CONDUCTIVE FILM

CROSS-REFERENCE TO RELATED APPLICATION

This application claims priority from and the benefit of Korean Patent Application No. 10-2019-0175526, filed on Dec. 26, 2019, which is hereby incorporated by reference for all purposes as if fully set forth herein.

BACKGROUND

Field

Exemplary embodiments relate generally to a device and a method of manufacturing a conductive film. More particularly, embodiments of the present inventive concept relate to a device and a method of manufacturing a conductive film including a conductive ball.

Discussion of the Background

Flat panel display devices are used as display devices for replacing a cathode ray tube display device due to light-weight and thin characteristics thereof. As representative examples of such flat panel display devices, there are a liquid crystal display device and an organic light emitting diode display device.

A plurality of pad electrodes connected to an external device may be disposed on the display device. For example, as the size of the display device increases and the resolution of the display device is higher, the number of signals inputted to the display device may increase, and the display device may include a relatively large number of pad electrodes to receive the signals from the external device. An interval between the pad electrodes may be relatively narrow such that a relatively large number of pad electrodes may be disposed in a limited space.

In order to electrically connect the pad electrodes to the external device, the display device may further include an anisotropic conductive film and a flexible printed circuit board disposed on the pad electrodes. The anisotropic conductive film may include conductive balls and a resin layer covering the conductive balls, and the flexible printed circuit board may include bump electrodes positioned to overlap the pad electrodes. Recently, anisotropic conductive films have been developed in which conductive balls are regularly arranged in one layer. For example, the conductive balls of the anisotropic conductive film do not overlap each other in a depth direction. When the flexible printed circuit board applies a pressure onto the anisotropic conductive film in the depth direction in the process of curing the anisotropic conductive film, the resin layer may reflow and the conductive ball may move in a random direction. In this case, the conductive balls may have nonuniform density and adjacent pad electrodes or adjacent bump electrodes may be shorted by the conductive balls.

The above information disclosed in this Background section is only for understanding of the background of the inventive concepts, and, therefore, it may contain information that does not constitute prior art.

SUMMARY

Exemplary embodiments provide a device for manufacturing a conductive film.

Exemplary embodiments also provide a method of manufacturing a conductive film.

Additional features of the inventive concepts will be set forth in the description which follows, and in part will be apparent from the description, or may be learned by practice of the inventive concepts.

Exemplary embodiments provide a device for manufacturing a conductive film includes a rotating member, a first syringe, and a second syringe. The rotating member rotates about an axis extending in a first direction. The first syringe is disposed over a first portion of the rotating member, and is configured to discharge a first polymer and conductive balls. The second syringe is adjacent to the first syringe, and is configured to discharge a second polymer.

In exemplary embodiments, the first polymer may have a first viscosity, and the second polymer may have a second viscosity lower than the first viscosity.

In exemplary embodiments, the first polymer may have a first molecular weight, and the second polymer may have a second molecular weight lower than the first molecular weight.

In exemplary embodiments, an electric field may be formed by applying a voltage to the first syringe, and the conductive balls may be periodically injected into the nano-fiber while the first polymer is discharged as a nano-fiber by the electric field.

In exemplary embodiments, the nano-fiber may surround a part of each of the conductive balls.

In exemplary embodiments, the nano-fiber and the conductive balls periodically injected into the nano-fiber may be defined as a nano-string, and the nano-string may be wound on the rotating member.

In exemplary embodiments, a width of the nano-string where the nano-fiber connecting two adjacent conductive balls among the conductive balls may be positioned is smaller than a width of the nano-string where the conductive balls are positioned.

In exemplary embodiments, the second polymer discharged from the second syringe may be wound on the rotating member alternately with the nano-string.

In exemplary embodiments, the rotating member may rotate in a clockwise direction at a first speed.

In exemplary embodiments, an interval between the conductive balls included in the nano-string may be determined by the first speed.

In exemplary embodiments, the first syringe and the second syringe may move at a second speed in the first direction while the nano-string is discharged, and may be positioned over a second portion opposite to the first portion of the rotating member.

In exemplary embodiments, an interval in the first direction between the conductive balls included in the nano-string wound on the rotating member may be determined by the second speed.

In exemplary embodiments, the second syringe may be positioned to overlap at least a part of the first syringe in a direction perpendicular to the first direction.

Exemplary embodiments also provide a method of manufacturing a conductive film is provided as follows. A rotating member rotates about as an axis extending in a first direction. A first syringe storing a first polymer and conductive balls is positioned over a first portion of the rotating member. The first polymer converts to a nano-fiber by using an electro-spinning scheme. The nano-fiber, into which the conductive balls are injected, is discharged from the first syringe by periodically injecting the conductive balls into the nano-fiber while the first syringe moves in the first direction.

In exemplary embodiments, the nano-fiber may surround a part of each of the conductive balls, and a width of the nano-string where the nano-fiber connecting two adjacent conductive balls among the conductive balls is positioned may be smaller than a width of the nano-string where the conductive balls are positioned.

In exemplary embodiments, the method may further include positioning a second syringe adjacent to the first syringe and storing a second polymer, discharging the second polymer from the second syringe while the second syringe moves in the first direction, and winding the nano-fiber, into which the conductive balls are injected, and the second polymer on the rotating member.

In exemplary embodiments, the second polymer discharged from the second syringe may be wound on the rotating member alternately with the nano-string.

In exemplary embodiments, the first polymer may have a first viscosity, and the second polymer may have a second viscosity lower than the first viscosity. The first polymer may have a first molecular weight, and the second polymer may have a second molecular weight lower than the first molecular weight.

In exemplary embodiments, each of the first polymer and the second polymer may include at least one selected from epoxy resin, amino resin, phenol resin, urea resin, melamine resin, unsaturated polyester resin, polyurethane resin, and polyimide resin.

In exemplary embodiments, the conductive ball may have a structure in which a spherical polymer is coated with a metal layer, such as nickel, cobalt, gold, silver, and copper.

The conductive film manufacturing device according to the exemplary embodiments of the present invention may connect the two adjacent conductive balls by using the nano-fiber, and may manufacture the conductive film by combining the conductive balls, which are connected to each other using the nano-fiber, with the second polymer. Therefore, the conductive film manufacturing device can manufacture the conductive film including the conductive balls movable only in one direction.

The conductive film including the conductive balls movable only in one direction may be manufactured by using the conductive film manufacturing device based on the method of manufacturing the conductive film according to the exemplary embodiments of the present invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
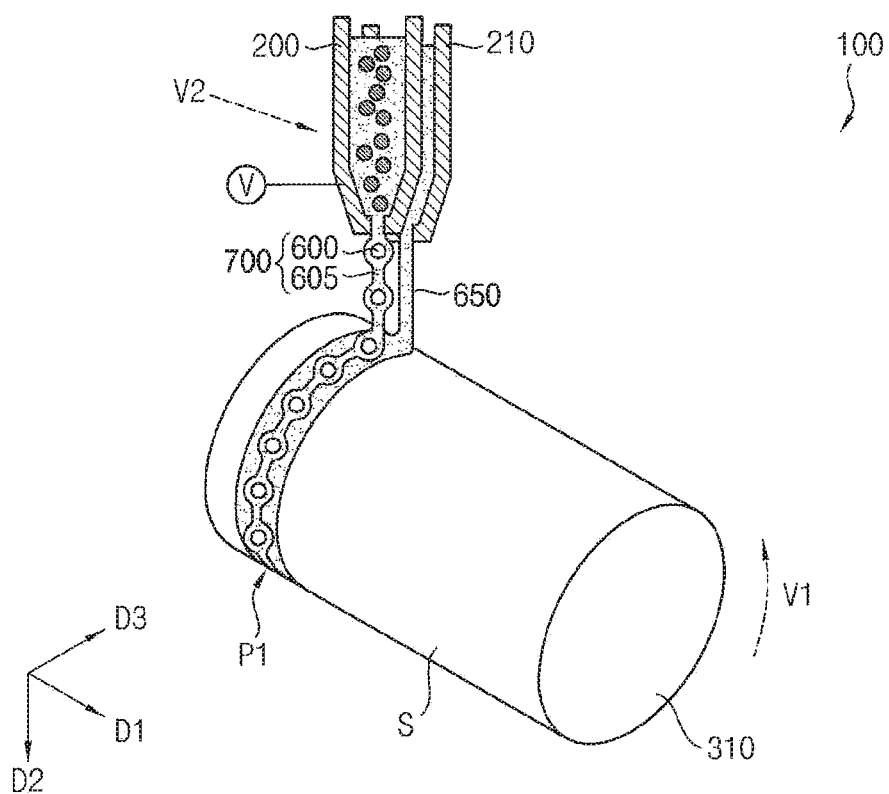
FIG. 1 is a perspective view illustrating a device configured to manufacture a conductive film according to an exemplary embodiment of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, devices configured to manufacture a conductive film and methods of manufacturing a conductive film according to exemplary embodiments of the present invention will be described in detail with reference to the accompanying drawings. In the accompanying drawings, same or similar reference numerals refer to the same or similar elements.

Figure 2:
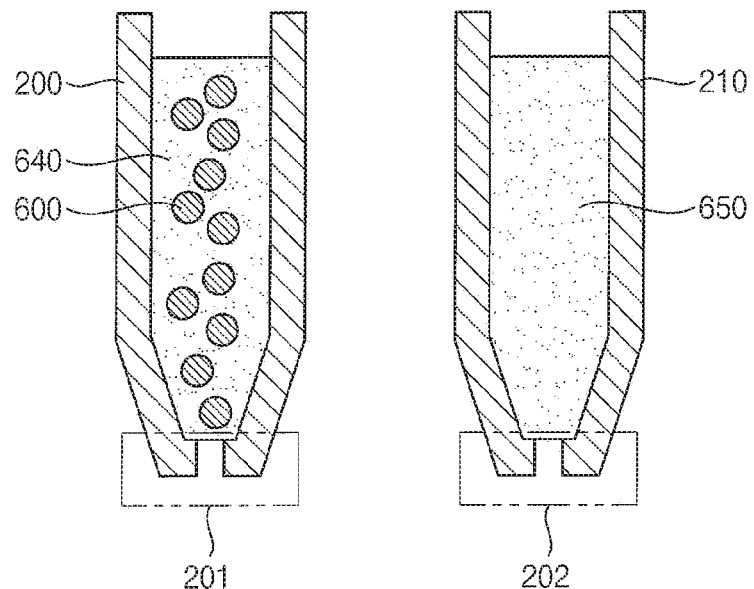
FIG. 2 and FIG. 3 are cross-sectional views illustrating first and second syringes included in the device configured to manufacture the conductive film of FIG. 1.
Figure 3:
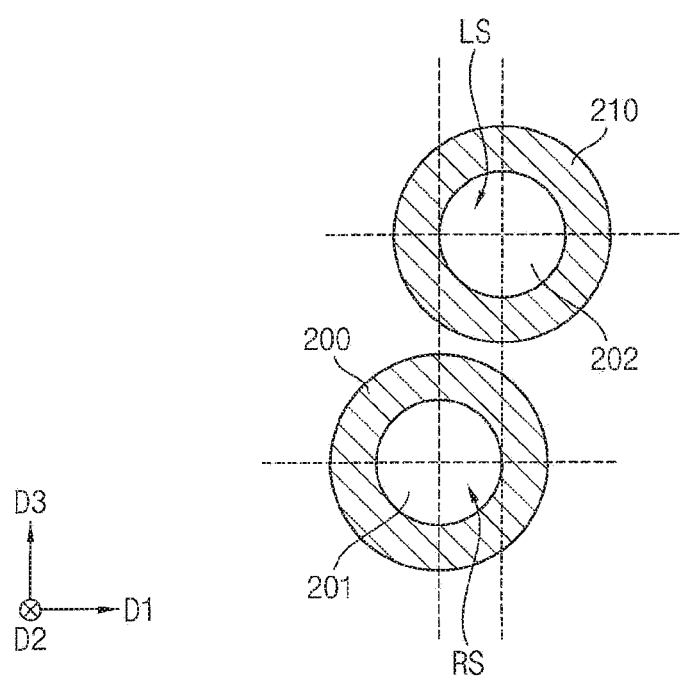

FIG. 1 is a perspective view illustrating a device configured to manufacture a conductive film according to the exemplary embodiments of the present invention. FIGS. 2 and 3 are cross-sectional views illustrating first and second syringes included in the device configured to manufacture the conductive film of FIG. 1. The first syringe 200 and the second syringe 210 illustrated FIGS. 1, 2 and 3 are illustrated using a sectional shape for convenience, but are not limited thereto.

Referring to FIGS. 1, 2 and 3, a conductive film manufacturing device 100 may include a rotating member 310, a first syringe 200 and a second syringe 210. The first syringe 200 may store a first polymer 640 and conductive balls 600, and may include a first discharge portion 201. The second syringe 210 may store a second polymer 650 and may include a second discharge portion 202. In the exemplary embodiments, a voltage V may be applied to the first syringe 200 to form an electric field, the first polymer 640 may be converted before exiting the syringe 200 to a nano-fiber 605 by the electric field, and the conductive balls 600 may be periodically injected into the nano-fiber 605 while the converted nano-fiber 605 is discharged through the first discharge portion 201. The nano-fiber 605 and the conductive balls 600 periodically injected into the nano-fiber 605 may be referred to as a nano-string 700.

The rotating member 310 may be provided. The rotating member 310 may rotate about an axis extending in a first direction D1. The rotation of the rotation member may appear clockwise or counter-clockwise depending on the vantage point. The speed of rotation of the rotating member 310 may be defined as a first speed V1. The second polymer 650 may be ejected from the second discharge portion 202 at relatively the same rate as the nano-string 700 is formed coming out of the first discharge portion 201. At an initial stage, the second polymer 650 is output first for a predetermined period of time on the rotation member 310 before the nano-string 700 is output. The initial output of the second polymer 650 is to lay a polymer foundation to receive the nano-string 700.

While the rotating member 310 rotates about the axis extending in the first direction D1, the nano-string 700 discharged from the first syringe 200 and the second polymer 650 discharged from the second syringe 210 may be wound around a winding surface S on the rotating member 310. The rotating member 310 may include a cylindrical drum.

The first syringe 200 may be positioned adjacent a first portion P1 of the rotating member 310 (for example, a left side of the winding surface S of the rotating member 310). The first syringe 200 may move in a spiral along the first direction D1 over the first portion P1 of the rotating member 310, and may move towards a second portion opposite to the first portion P1 of the rotating member 310 (for example, a right side of the winding surface S of the rotating member 310). The speed of the first syringe 200 moving to the second portion from the first portion P1 of the rotating member 310 is defined as a second speed V2. The first syringe 200 may include metal, metal alloy or the like such as steel use stainless (SUS). As described above, the first syringe 200 may discharge the first polymer 640 and the conductive balls 600 in a second direction D2 perpendicular to the first direction D1.

Figure 4:
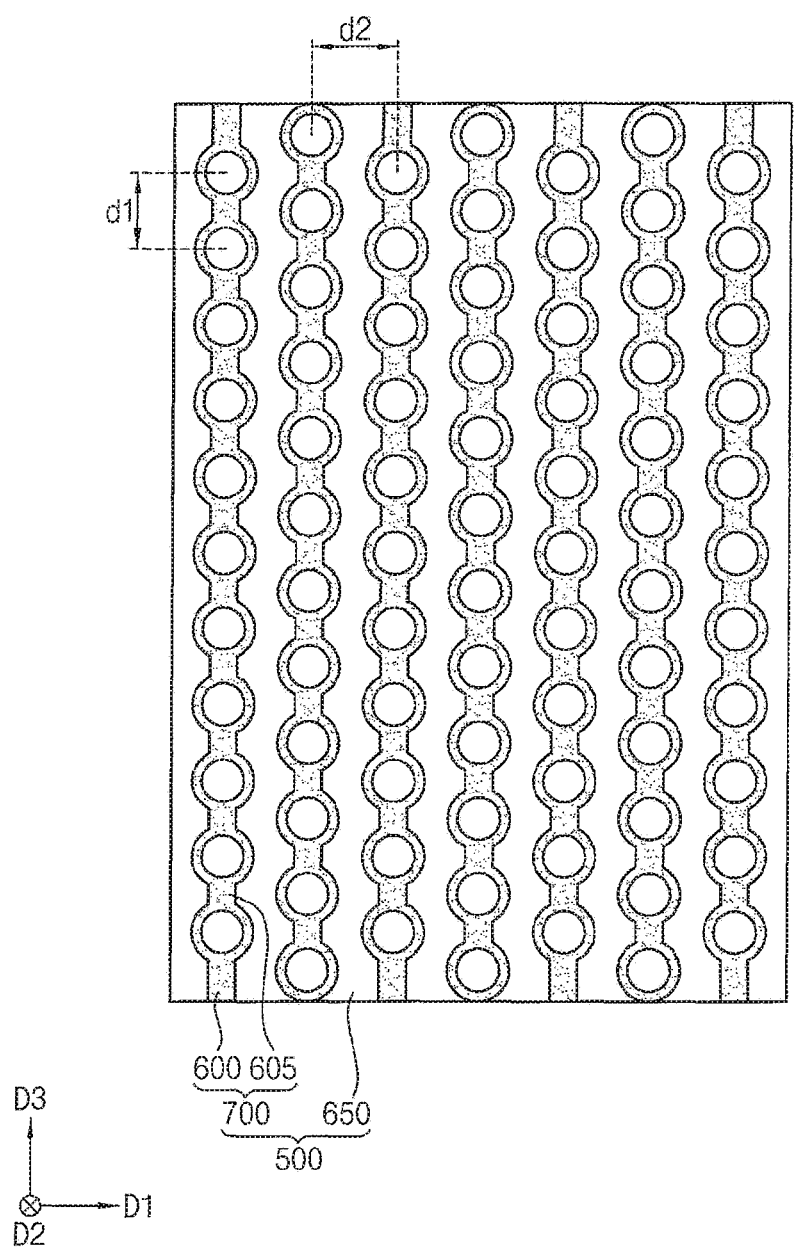
FIG. 4, FIG. 5 and FIG. 6 are plan views illustrating a conductive film manufactured by the conductive film manufacturing device of FIG. 1.
Figure 5:
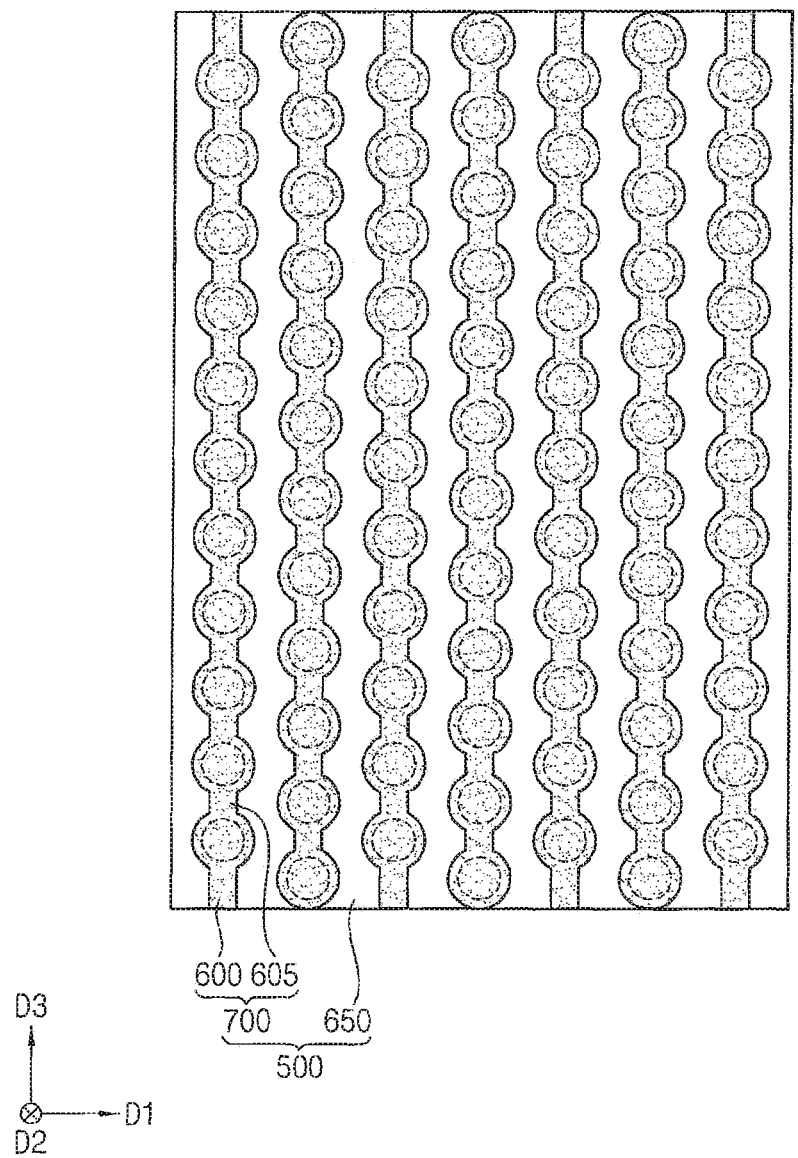

In the exemplary embodiments, the first polymer 640 stored in the first syringe 200 may be converted to nano-fiber 605 by using an electro-spinning scheme, and the first syringe 200 may discharge the nano-string 700 in which the nano-fiber 605 connects the conductive balls 600 to each other while partially surrounding each of the conductive balls 600. For example, when the nano-fiber 605 surrounds a part of each conductive ball 600, the nano-string 700 may have a shape as illustrated in FIG. 4, and when the nano-fiber 605 completely surrounds each of the conductive balls 600, the nano-string 700 may have a shape as illustrated in FIG. 5.

A width of the nano-string 700 disposed therein with the nano-fiber 605 connecting two adjacent conductive balls 600 among the conductive balls 600 may be smaller than the width of the nano-string 700 disposed therein that has the conductive balls 600. Alternatively, the width of the nano-string 700 disposed therein with the nano-fiber 605 connecting the two adjacent conductive balls 600 may be manufactured to be equal to or larger than the width of the nano-string 700 disposed therein with the conductive balls 600. For example, the width of the nano-fiber 605 connecting the two adjacent conductive balls 600 and the degree of surrounding the conductive balls 600 by the nano-fiber 605 may be determined by a diameter of the first discharge portion 201, a viscosity of the first polymer 640, a molecular weight of the first polymer 640, a size of the electric field applied to the first syringe 200, a discharge pressure to discharge the nano-string 700, and the like. In other words, the connection strength of two adjacent conductive balls 600 may be controlled by adjusting the thickness of the nano-fiber 605 connecting two adjacent conductive balls 600 and the degree of surrounding the conductive balls 600 by the nano-fiber 605.

In the exemplary embodiments, the first discharge portion 201 and the second discharge portion 202 may be opened and closed according to electrical signals from a control module (not illustrated). For example, when a first signal is applied to the first discharge portion 201, the first discharge portion 201 may be opened to discharge the nano-string 700. A second signal may control opening and closing of the second discharge portion 202. When the first and second signals are not applied, the first discharge portion 201 and the second discharge portion 202 may be closed and the nano-string 700 may not be discharged (see FIG. 7).

In the exemplary embodiments, the first polymer 640 may have a first viscosity and a first molecular weight. Viscosity may refer to a friction between the molecules of a fluid. A high viscosity fluid may be thicker than a low viscosity fluid. The first polymer 640 may include a thermosetting resin or photo-curable resin having a relatively high viscosity and a relatively high molecular weight. For example, the relatively high viscosity and the high molecular weight may be used for the first polymer 640 to bond the polymer 640 to the conductive balls 600 and manufacture the first polymer 640 into the nano-fiber 605 by using the electro-spinning scheme. In other words, when each of the viscosity and the molecular weight of the first polymer 640 is relatively low, the first polymer 640 may be too thin to be converted to nano-fiber 605.

Each of the conductive balls 600 may have a structure in which a spherical polymer is coated with a metal layer such as nickel, cobalt, gold, silver, or copper. In addition, the first polymer 640 may include epoxy resin, amino resin, phenol resin, urea resin, melamine resin, unsaturated polyester resin, polyurethane resin, polyimide resin, and the like. Selectively, the first polymer 640 may include polyolefine, polyamide (PA), polyester, aramid, acrylic, polyethylene oxide (PEO), polycaprolactone, polycarbonate (PC), polystyrene (PS), polyethylene terephthalate (PET), polybenzimidazole (PBI), polyacrylonitrile, poly(2-hydroxyethyl methacrylate), polyvinylidene fluoride, poly(ether imide), styrene-butadiene-styrene triblock copolymer (SBS), poly (ferrocenyldimethylsilane), and the like. These may be used individually or in combination.

The second syringe 210 may be positioned adjacent to the first syringe 200 over the first portion P1 of the rotating member 310. In other words, the second syringe 210 may be spaced apart from the first syringe 200. Selectively, the second syringe 210 may come into contact with one side of the first syringe 200. As illustrated in FIGS. 1 and 3, the second syringe 210 may be positioned to overlap at least a part of the first syringe 200 in a third direction D3, the first direction D1, and the second direction D2. For example, a right side RS of the first discharge portion 201 and a left side LS of the second discharge portion 202 may overlap each other in the third direction D3. The second syringe 210 may move in a spiral shape at the second speed V2 in the first direction D1 together with the first syringe 200 over the first portion P1 of the rotating member 310, and may conclude together with the first syringe 200 over the second portion P2 of the rotating member 310. The second syringe 210 may include metal, metal alloy or the like such as SUS. As described above, the second syringe 210 may discharge the second polymer 650 in the second direction D2.

In the exemplary embodiments, the second discharge portion 202 may be opened and closed according to the second signal. For example, when the second signal is applied, the second discharge portion 202 may be opened to discharge the second polymer 650. On the contrary, when the second signal is not applied, the second discharge portion 202 may be closed, so that the second polymer 650 may not be discharged (see FIG. 7).

In the exemplary embodiments, the second polymer 650 may have a second viscosity lower than the first viscosity and a second molecular weight lower than the first molecular weight. The second polymer 650 may include a thermosetting resin or photo-curable resin having a relatively low viscosity and a relatively low molecular weight. The second polymer 650 discharged from the second syringe 210 may be wound on the winding surface S of the rotating member 310 alternately with the nano-string 700 discharged from the first syringe 200.

Figure 6:
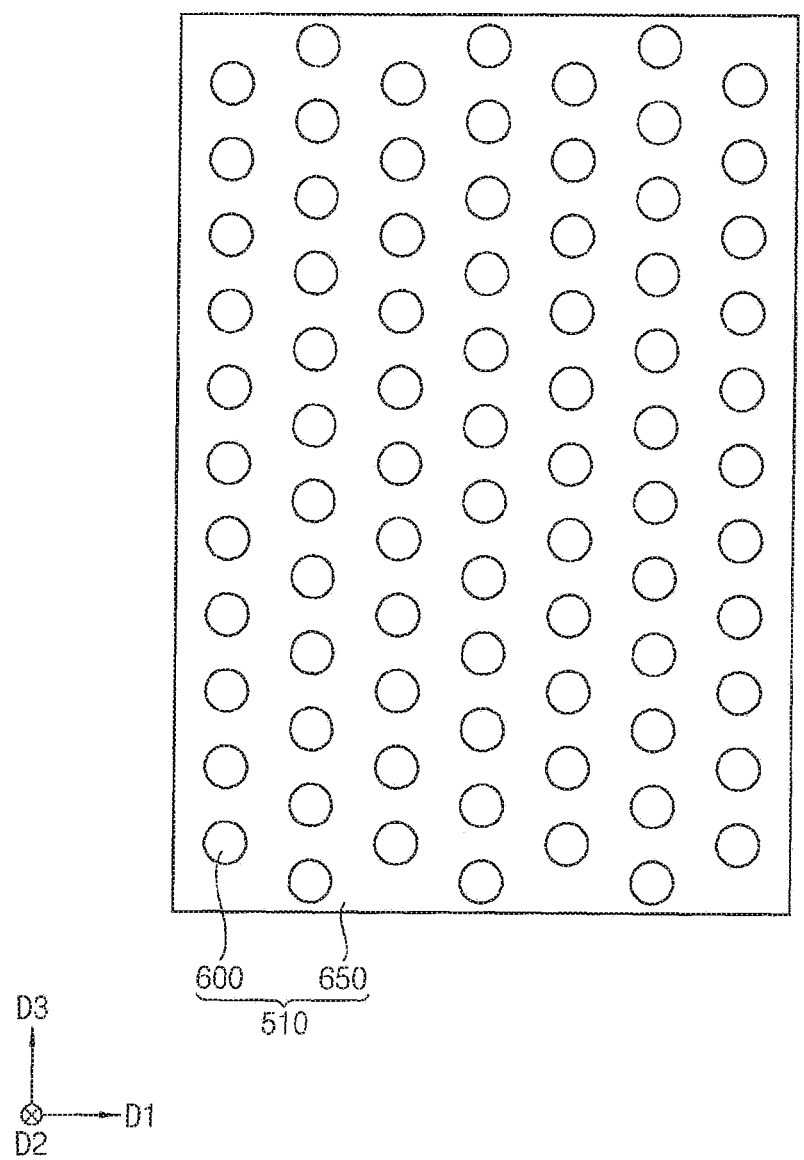
Figure 8:
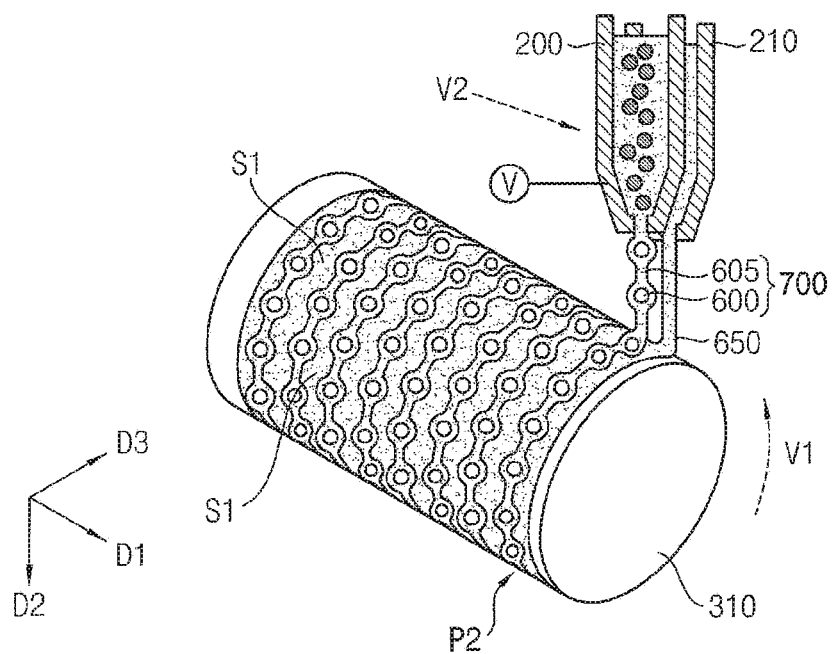
Figure 12:
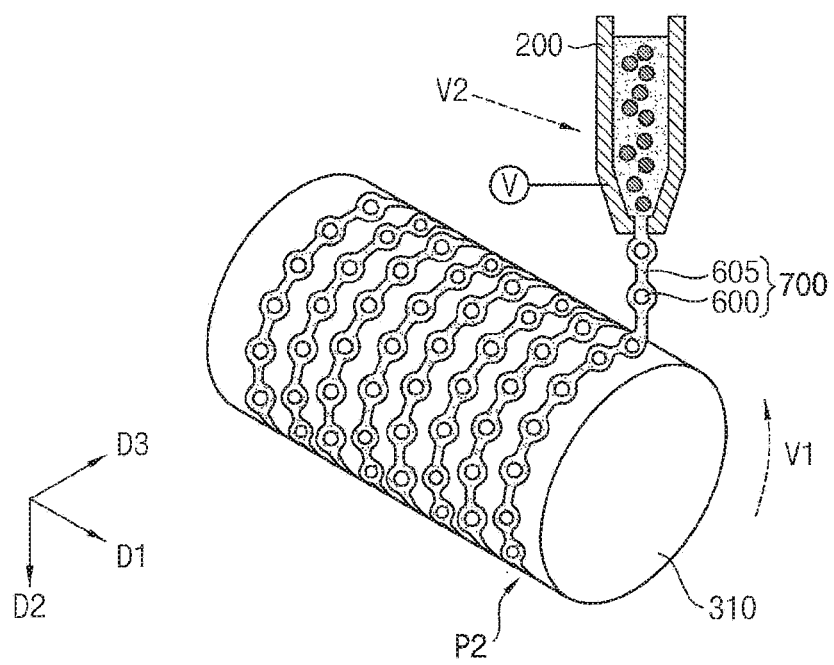

As illustrated in FIG. 8, the second polymer 650 has a relatively low viscosity, so that the second polymer 650 may fill a space S1 between two adjacent nano-strings 700 disposed on the winding surface S. For example, when only the nano-string 700 is wound on the winding surface S, an empty space may exist between two adjacent nano-strings 700 disposed on the winding surface S as illustrated in FIG. 12. In FIG. 8 the second polymer 650 fills the space S1 so that a conductive film 500 may be manufactured as illustrated in FIG. 4. In FIGS. 4-6 the second polymer 650 is not shaded as in FIG. 8, but the film 500 is formed. Selectively, when the nano-string 700 is discharged from the first syringe 200 after the second polymer 650 is discharged first from the second syringe 210, the second polymer 650 may be formed on both sides of the nano-string 700 disposed in columns as illustrated in FIGS. 1 and 4.

Alternatively, because the second syringe 210 may be offset in the D3 direction as illustrated in FIG. 3 from the first syringe 200, the second polymer 650 may be deposited on one side of the nano-string 700, yet still underneath the nano-string 700 to form the conductive film 500. Additionally, instead of the second syringe 210 being disposed on the right side of the first syringe 200, the second syringe 210 may be offset in the D3 direction on the left side of the first syringe 200. In such a case the second syringe 210 may form the second polymer 650 under and to the left of the nano-string 700 to form the conductive film 500.

According to one method of manufacturing a display device, an anisotropic conductive film may be interposed between the pad electrodes and a flexible printed circuit board connected to the external device such that pad electrodes included in the display device are electrically connected to an external device that generates a signal. The anisotropic conductive film may include conductive balls 600 and a resin layer (such as the second polymer 650) configured to cover the conductive balls, and the flexible printed circuit board may include bump electrodes positioned to overlap the pad electrodes. In the process of curing the anisotropic conductive film in which the conductive balls 600 are regularly arranged in one layer, the resin layer may reflow and the conductive ball 600 may move in a random direction when the flexible printed circuit board applies a pressure onto the anisotropic conductive film in a depth direction. In this case, the conductive balls 600 may have the nonuniform density and adjacent pad electrodes or adjacent bump electrodes may be shorted by the conductive balls.

The conductive film manufacturing device 100 according to the exemplary embodiments of the present invention may connect two adjacent conductive balls 600 by using the nano-fiber 605, and may manufacture the conductive film 500 by combining the conductive balls 600, which are connected to each other using the nano-fiber 605, with the second polymer 650. When the conductive film 500 reflows in the process of curing the conductive film 500, the conductive balls 600 may move only in the third direction D3 due to the nano-fiber 605. In this case, adjacent pad electrodes included in the display device and adjacent bump electrodes included in the flexible circuit board may not be shorted by the conductive balls 600. Therefore, the conductive film manufacturing device can manufacture the conductive film 500 including the conductive balls 600 movable only in one direction.

FIGS. 4, 5 and 6 are plan views illustrating a conductive film manufactured by the conductive film manufacturing device of FIG. 1.

Referring to FIG. 4, the conductive film 500 may include the nano-string 700 and the second polymer 650. The nano-string 700 may include the conductive balls 600 and the nano-fiber 605.

The first polymer 640 stored in the first syringe 200 may be converted to the nano-fibers 605 by using an electro-spinning scheme, and the first syringe 200 may discharge the nano-string 700 in which the nano-fiber 605 connects the conductive balls 600 to each other while partially surrounding each of the conductive balls 600. For example, the nano-fiber 605 may come into contact with a central portion of each conductive ball 600, and at least a part of upper and/or lower portions of each of the conductive balls 600 may be exposed by the nano-fiber 605. Thus in FIG. 4 the conductive balls 600 may be partially surrounded by the nano-fibers 605.

The width of the nano-fiber 605 connecting the two adjacent conductive balls 600 and the degree of surrounding the conductive balls 600 by the nano-fiber 605 may be determined by a diameter of the first discharge portion 201, a viscosity of the first polymer 640, a molecular weight of the first polymer 640, a size of the electric field applied to the first syringe 200, a discharge pressure to discharge the nano-fiber 605, and the like. In other words, the connection strength of the two adjacent conductive balls 600 may be controlled by adjusting the thickness of the nano-fiber 605 connecting the two adjacent conductive balls 600 and the degree of surrounding the conductive balls 600 by the nano-fiber 605. For example, when a difference between the viscosity of the first polymer 640 and the viscosity of the second polymer 650 is relatively large, the nano-fiber 605 may not be integrally formed with the second polymer 650. In this case, the connection strength of the two adjacent conductive balls 600 may be relatively large.

In addition, the speed of the rotating member 310 rotating clockwise may be defined as a first speed V1, and the speeds of the first syringe 200 and the second syringe 210 moving to the second portion P2 from the first portion P1 of the rotating member 310 may be defined as a second speed V2. A first distance d1 between adjacent conductive balls 600 in a nano-string 700 in the third direction D3 illustrated in FIG. 4 may be determined by the first speed V1, and a second distance d2 between the adjacent nano-strings 700 (or the conductive balls 600 of the adjacent nano-strings 700) in the first direction D1 may be determined by the second speed V2. In the exemplary embodiments, the conductive balls 600 may have the same first distance d1, and the nano-strings 700 may have the same second distance d2. The distances d1 and d2 may also respectively vary depending on desired conductive ball 600 spacing and amount of nano-strings 700 to be deposited on the rotating member 310.

In other exemplary embodiments, as illustrated in FIG. 5, the first syringe 200 may discharge the nano-string 700 in which the nano-fiber 605 connects the conductive balls 600 to each other while completely surrounding each of the conductive balls 600. For example, the conductive balls 600 may not be exposed to the outside due to the encompassing nano-fiber 605.

Referring to FIG. 6, a conductive film 510 may include conductive balls 600 and a second polymer 650.

The first polymer 640 stored in the first syringe 200 may be converted to nano-fiber 605 by using the electro-spinning scheme, and the first syringe 200 may discharge the nano-string 700 in which the nano-fiber 605 connects the conductive balls 600 to each other while partially surrounding each of the conductive balls 600. For example, the nano-fiber 605 may come into contact with a central portion of each of the conductive balls 600, and at least a part of upper and/or lower portions of each of the conductive balls 600 may be exposed by the nano-fiber 605.

The width of the nano-fiber 605 connecting the two adjacent conductive balls 600 and the degree of surrounding the conductive balls 600 by the nano-fiber 605 may be determined by a diameter of the first discharge portion 201, a viscosity of the first polymer 640, a molecular weight of the first polymer 640, a size of the electric field applied to the first syringe 200, a discharge pressure to discharge the nano-string 700, and the like. In other words, the connection strength of the two adjacent conductive balls 600 may be controlled by adjusting the thickness of the nano-fiber 605 connecting the two adjacent conductive balls 600 and the degree of surrounding the conductive balls 600 by the nano-fiber 605.

For example, when a difference between the viscosity of the first polymer 640 and the viscosity of the second polymer 650 is relatively small, the nano-fiber 605 may be integrally formed with the second polymer 650. In this case, the connection strength of the two adjacent conductive balls 600 may be relatively small.

Figure 7:
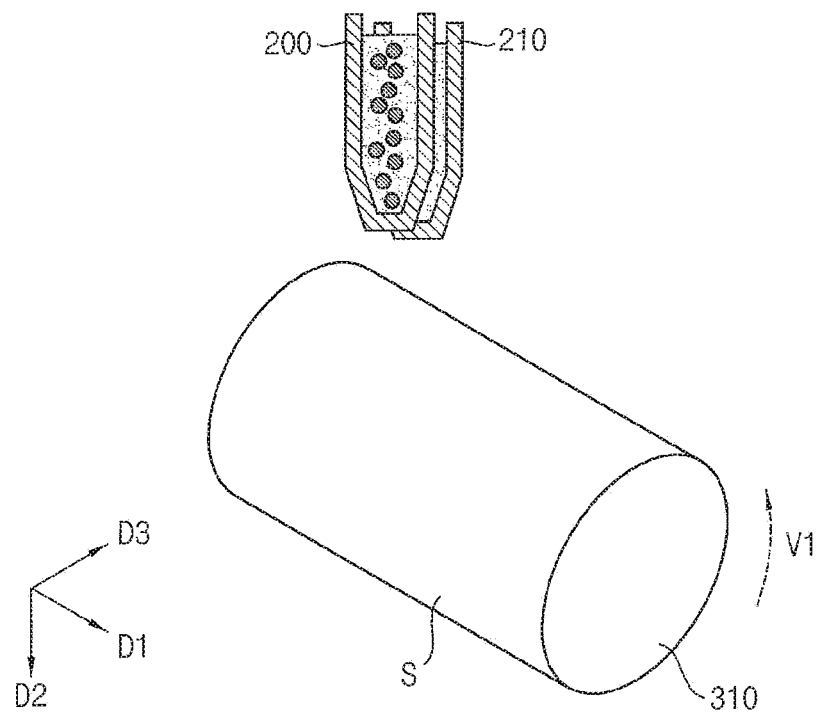
FIG. 7, FIG. 8 and FIG. 9 are views illustrating the method of manufacturing the conductive film according to exemplary embodiments of the present invention.
Figure 9:
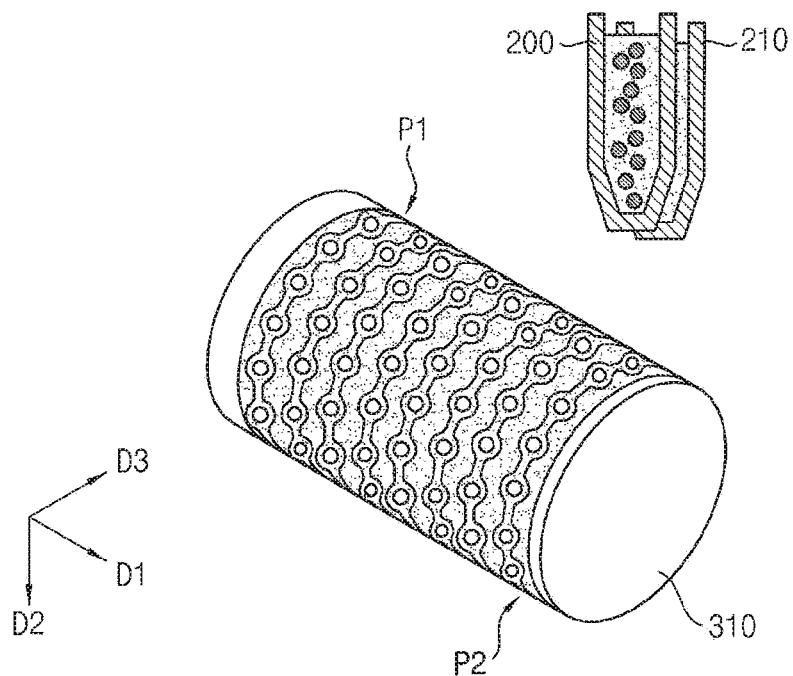

FIGS. 7 to 9 are views illustrating a method of manufacturing the conductive film according to an exemplary embodiment of the present invention.

Referring to FIG. 7, the rotating member 310 may be provided. The rotating member 310 may rotate about an axis extending in the first direction D1. The speed of the rotating member 310 rotating is defined as a first speed V1. The first speed V1 may help control spacing between adjacent conductive balls 600 and surrounding coverage of the nano-fiber 605 on the conductive balls 600. The rotating member 310 may include a cylindrical drum.

The first syringe 200 may be positioned over the first portion P1 of the rotating member 310. A first polymer 640 and conductive balls 600 may be stored in the first syringe 200. As illustrated in FIGS. 2 and 3, the first discharge portion 201 may be opened and closed according to the first signal. For example, the signal may not be applied to the first syringe 200 so that the first discharge portion 201 may be closed. The first polymer 640 may have a first viscosity and a first molecular weight. The first polymer 640 may include a thermosetting resin or photo-curable resin having a relatively high viscosity and a relatively high molecular weight.

The second syringe 210 may be positioned adjacent to the first syringe 200 over the first portion P1 of the rotating member 310. In other words, the second syringe 210 may be spaced apart from the first syringe 200. The second syringe 210 may store a second polymer 650. As illustrated in FIGS. 2 and 3, the second discharge portion 202 may be opened and closed according to the second signal. For example, when the second signal is not applied to the second syringe 210, the second discharge portion 202 is in a closed state. The second polymer 650 may have a second viscosity lower than the first viscosity and a second molecular weight lower than the first molecular weight. The second polymer 650 may include a thermosetting resin or photo-curable resin having a relatively low viscosity and a relatively low molecular weight.

Each of the first syringe 200 and the second syringe 210 may be formed using metal, metal alloy or the like such as SUS. In addition, each of the conductive balls 600 may have a structure in which a spherical polymer is coated with a metal layer such as nickel, cobalt, gold, silver, or copper. In addition, each of the first polymer 640 and the second polymer 650 may include epoxy resin, amino resin, phenol resin, urea resin, melamine resin, unsaturated polyester resin, polyurethane resin, polyimide resin, and the like. Selectively, each of the first polymer 640 and the second polymer 650 may include polyolefine, PA, polyester, aramid, acrylic, PEO, polycaprolactone, PC, PS, PET, PBI, polyacrylonitrile, poly(2-hydroxyethyl methacrylate), polyvinylidene fluoride, poly(ether imide), SBS, poly(ferrocenyldimethylsilane), and the like. These may be used individually or in combination.

Referring to FIG. 1, the second signal (not illustrated) may be applied to the second syringe 200, and the second discharge portion 202 may be opened. The second syringe 210 may discharge the second polymer 650 in the second direction D2 through the second discharge portion 202. The second signal may indicate to the second syringe 210 to start depositing the second polymer 650 before the first syringe 200 is instructed to deposit the nano-string 700.

A voltage V may be applied to the first syringe 200 to form an electric field by using an electro-spinning scheme, and the first polymer 640 may be converted to the nano-fiber 605 by the electric field. In addition, the first signal may be applied to the first syringe 200, so that the first discharge portion 201 may be opened. While the nano-fiber 605 is discharged in the second direction D2 through the first discharge portion 201, the conductive balls 600 may be periodically injected into the nano-fiber 605. The nano-fiber 605 and the conductive balls 600 periodically injected into the nano-fiber 605 are defined as the nano-string 700. In other words, the first syringe 200 may discharge the nano-string 700 in which the nano-fiber 605 connects the conductive balls 600 to each other while partially or wholly surrounding each of the conductive balls 600. In the exemplary embodiments, the width of a connection portion of the nano-string 700 where the nano-fiber 605 connects two adjacent conductive balls 600 may be smaller than the width of the nano-string 700 disposed therein with the conductive balls 600.

The first syringe 200 and the second syringe 210 may move at the second speed V2 in the first direction D1 over the first portion P1 of the rotating member 310.

Referring to FIG. 8, while the first syringe 200 and the second syringe 210 are moving to the second portion P2 from the first portion P1 of the rotating member 310 at the second speed V2, the second polymer 650 discharged from the second syringe 210 may be wound on the winding surface S of the rotating member 310 alternately with the nano-string 700 discharged from the first syringe 200. The second polymer 650 has a relatively low viscosity, so that the second polymer 650 may fill a space between two adjacent nano-strings 700 disposed on the winding surface S.

Referring to FIG. 9, the first syringe 200 and the second syringe 210 may be positioned over the second portion P2 opposite to the first portion P1 of the rotating member 310. The first and second signals may cease being applied to the first syringe 200 and the second syringe 210, and the first discharge portion 201 and the second discharge portion 202 may be closed. Therefore, the conductive film 500 including the conductive balls 600 movable only in one direction may be manufactured by using the conductive film manufacturing device 100 illustrated in FIGS. 1 to 3 based on the method of manufacturing the conductive film according to the exemplary embodiments of the present invention.

Figure 10:
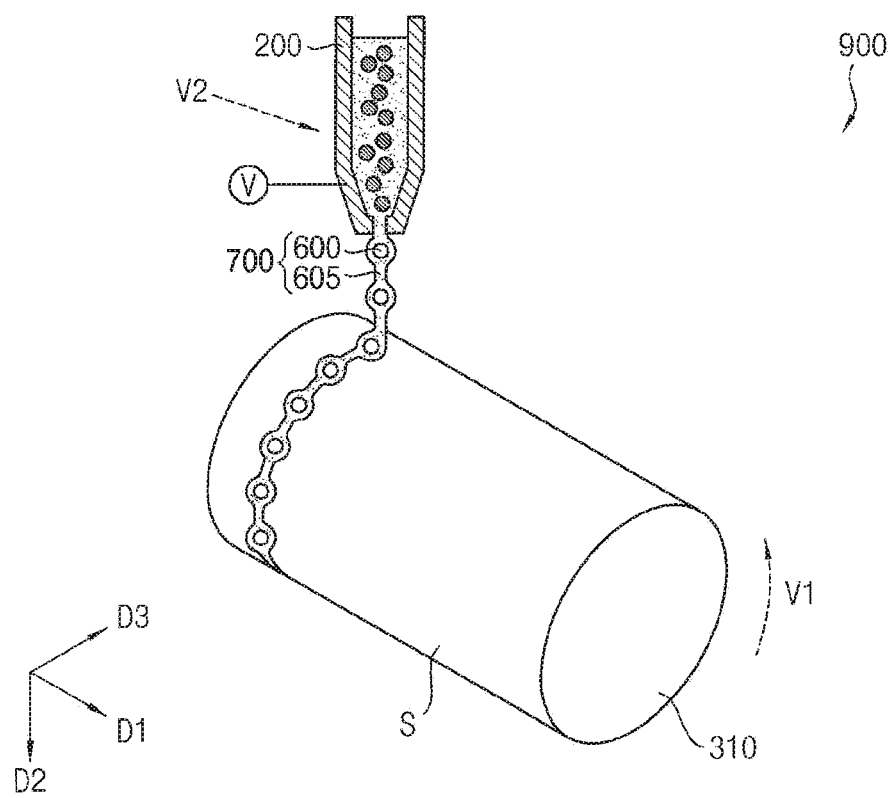
FIG. 10 is a perspective view illustrating the device configured to manufacture the conductive film according to exemplary embodiments of the present invention.

FIG. 10 is a perspective view illustrating the device configured to manufacture the conductive film according to the exemplary embodiments of the present invention. The conductive film manufacturing device 900 illustrated in FIG. 10 may have substantially the same or similar configuration as the conductive film manufacturing device 100 described with reference to FIGS. 1 to 3. In FIG. 10, duplicate descriptions for components substantially the same as or similar to the components described with reference to FIGS. 1 to 3 will be omitted.

Referring to FIGS. 10 to 14, the conductive film manufacturing device 900 may include a first rotating member 310, a second rotating member 320, a third rotating member 330, and a syringe 200. The syringe 200 may store a polymer 640 and conductive balls 600, and may include a discharge portion 201. In the exemplary embodiments, a voltage V may be applied to the syringe 200 to form an electric field, the polymer 640 may be converted to a nano-fiber 605 by the electric field, and the conductive balls 600 may be periodically injected into the nano-fiber 605 while the nano-fiber 605 is discharged through the discharge portion 201 as the nano-string 700. The nano-fiber 605 and the conductive balls 600 periodically injected into the nano-fiber 605 may come together as the nano-string 700. The conductive film manufacturing device 900 may use the first syringe 200 in a first stage to deposit the nano-string 700 upon the first rotating member 310 and add a second polymer conductive film at a later stage.

The first rotating member 310 may be provided. The first rotating member 310 may rotate clockwise about an axis extending in the first direction D1. The speed of the first rotating member 310 rotating clockwise is defined as a first speed V1. While the first rotating member 310 rotates clockwise about the axis extending in the first direction D1, the nano-string 700 discharged from the syringe 200 may be wound around a winding surface S on the first rotating member 310. The first rotating member 310 may include a cylindrical drum.

The syringe 200 may be positioned over the first portion P1 of the first rotating member 310. The syringe 200 may move along the first direction D1 over the first portion P1 of the first rotating member 310, and may be positioned over a second portion P2 opposite to the first portion P1 of the first rotating member 310. The speed of the syringe 200 moving to the second portion P2 from the first portion P1 of the first rotating member 310 is defined as a second speed V2. The syringe 200 may include metal, metal alloy or the like such as SUS. As described above, the syringe 200 may discharge the polymer 640 and the conductive balls 600 in the second direction D2.

In the exemplary embodiments, the polymer 640 stored in the syringe 200 may be converted to nano-fiber 605 by using an electro-spinning scheme, and the syringe 200 may discharge the nano-string 700 in which the nano-fiber 605 connects the conductive balls 600 to each other while partially surrounding each of the conductive balls 600. The width of the nano-string 700 disposed therein with the nano-fiber 605 connecting two adjacent conductive balls 600 among the conductive balls 600 may be smaller than the width of the nano-string 700 disposed therein having the conductive balls 600.

In the exemplary embodiments, the discharge portion 201 may be opened and closed according to a first electrical signal. For example, when the first signal is applied, the discharge portion 201 may be opened to discharge the nano-string 700. On the contrary, when the signal is not applied, the discharge portion 201 may be closed and the nano-string 700 may not be discharged (see FIG. 11). The first signal may be applied from when the syringe 200 is disposed at the first portion P1 until the syringe 200 reaches a predetermined point in the second portion P2, and then ceases depositing the nano-string 700.

In the exemplary embodiments, the polymer 640 may include a thermosetting resin or photo-curable resin having a relatively high viscosity and a relatively high molecular weight. For example, the relatively high viscosity and the high molecular weight are required for the polymer 640 to manufacture the polymer 640 into the nano-fiber 605 by using the electro-spinning scheme. In other words, when each of the viscosity and the molecular weight of the polymer 640 is relatively low, the polymer 640 may not be converted to nano-fiber 605.

Each of the conductive balls 600 may have a structure in which a spherical polymer is coated with a metal layer such as nickel, cobalt, gold, silver, or copper. In addition, the polymer 640 may include epoxy resin, amino resin, phenol resin, urea resin, melamine resin, unsaturated polyester resin, polyurethane resin, polyimide resin, and the like. Selectively, the first polymer 640 may include polyolefine, PA, polyester, aramid, acrylic, PEO, polycaprolactone, PC, PS, PET, PBI, polyacrylonitrile, poly(2-hydroxyethyl methacrylate), polyvinylidene fluoride, poly(ether imide), SBS, poly(ferrocenyldimethylsilane), and the like. These may be used individually or in combination.

Figure 14:
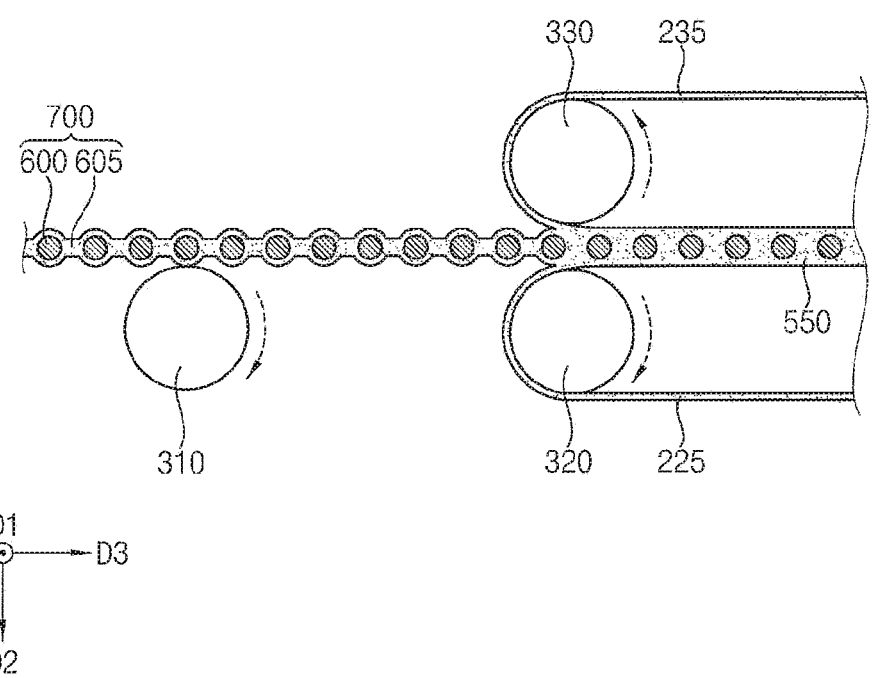

After the syringe 200 moves to the second portion P2 from the first portion P1 of the first rotating member 310, and the nano-string 700 is wound around the winding surface S on the first rotating member 310, the nano-string 700 may be cut in the first direction of the first rotating member 310. As illustrated in FIG. 14, the cut nano-string 700 may be moved by the first rotating member 310 in the third direction D3 by rotating the first rotating member 310 in the clockwise direction, and the cut nano-string 700 may be positioned between the second rotating member 320 and the third rotating member 330. Each of the second rotating member 320 and the third rotating member 330 may include a cylindrical drum.

The second rotating member 320 may rotate in the clockwise direction, and the third rotating member 330 may rotate in the counterclockwise direction. A first resin layer 225 may move between the second rotating member 320 and the third rotating member 330 through the second rotating member 320, and a second resin layer 235 may move between the second rotating member 320 and the third rotating member 330 through the third rotating member 330.

In other words, the nano-string 700 moved between the second rotating member 320 and the third rotating member 330 may be combined with the first resin layer 225 and the second resin layer 235 through the second rotating member 320 and the third rotating members 330. Therefore, the conductive film 550 may be manufactured. The conductive film 550 may completely surround the nano-string 700. In other words, the conductive balls 600 may not be exposed to the outside by the first resin layer 225 and the second resin layer 235. Each of the first resin layer 225 and the second resin layer 235 may include substantially the same material as the polymer 640.

The conductive film manufacturing device 900 according to the exemplary embodiments of the present invention may manufacture a conductive film 550 that may completely cover a nano-string 700 including conductive balls 600 movable only in one direction.

FIGS. 11 to 14 are views illustrating the method of manufacturing a conductive film according to an exemplary embodiment of the present invention.

Figure 11:
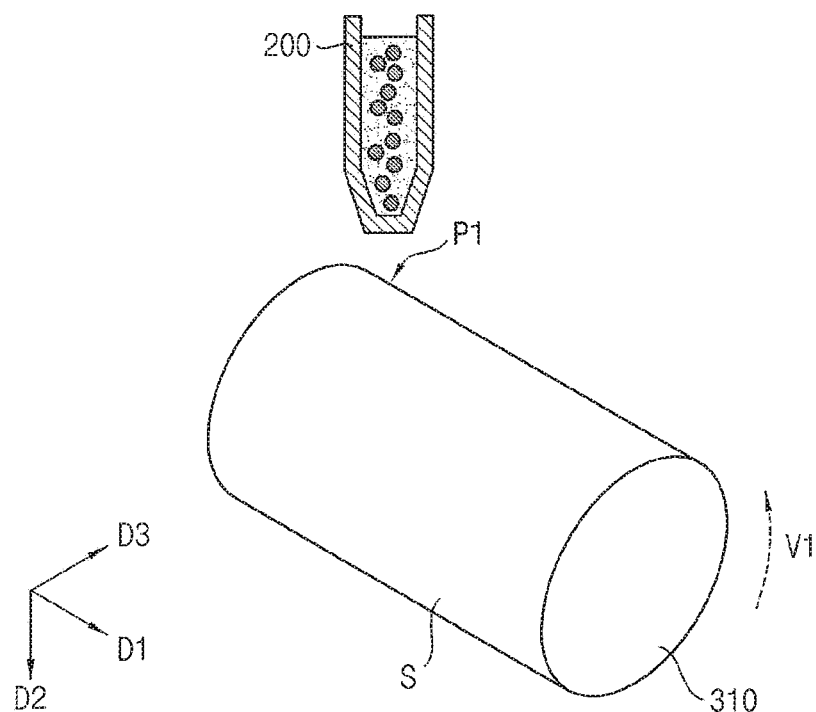
FIG. 11, FIG. 12, FIG. 13, and FIG. 14 are views illustrating the method of manufacturing a conductive film according to exemplary embodiments of the present invention.

Referring to FIG. 11, the first rotating member 310 may be provided. The first rotating member 310 may rotate clockwise about an axis extending in the first direction D1. The speed of the first rotating member 310 rotating clockwise is defined as a first speed V1.

The syringe 200 may be positioned over the first portion P1 of the first rotating member 310. The syringe 200 may store a polymer 640 and conductive balls 600. As illustrated in FIGS. 2 and 3, the discharge portion 201 may be opened and closed according to an electrical signal. For example, the signal is not applied to the syringe 200, and the discharge portion 201 is in a closed state. The polymer 640 may have a first viscosity and a first molecular weight. The polymer 640 may include a thermosetting resin or photo-curable resin having a relatively high viscosity and a relatively high molecular weight. In addition, each of the conductive balls 600 may have a structure in which is coated on a spherical polymer a metal layer such as nickel, cobalt, gold, silver, or copper. In addition, the syringe 200 may be formed using metal, metal alloy or the like such as SUS.

Referring to FIG. 12, a voltage V may be applied to the syringe 200 to form a electric field by using an electro-spinning scheme, and the polymer 640 may be converted to the nano-fiber 605 by the electric field. In addition, the signal may be applied to the syringe 200, and the discharge portion 201 may be opened. While the nano-fiber 605 is discharged in the second direction D2 through the discharge portion 201, the conductive balls 600 may be periodically injected into the nano-fiber 605. The nano-fiber 605 and the conductive balls 600 periodically injected into the nano-fiber 605 are defined as a nano-string 700. In other words, the syringe 200 may discharge the nano-string 700 in which the nano-fiber 605 connects the conductive balls 600 to each other while partially surrounding each of the conductive balls 600. In the exemplary embodiments, the width of the nano-string 700 disposed therein with the nano-fiber 605 connecting two adjacent conductive balls 600 among the conductive balls 600 may be smaller than the width of the nano-string 700 disposed therein with the conductive balls 600.

The syringe 200 may move at the second speed V2 along the first direction D1 over the first portion P1 of the rotating member 310.

Referring to FIG. 12, while the syringe 200 is moving to the second portion P2 from the first portion P1 of the rotating member 310 at the second speed V2, the nano-string 700 discharged from the syringe 200 may be wound around a winding surface S on the rotating member 310.

Figure 13:
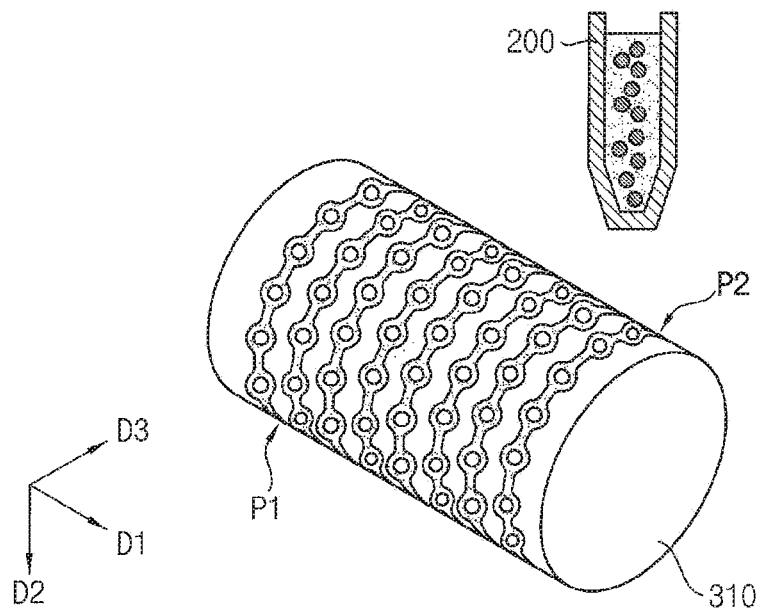

Referring to FIG. 13, the syringe 200 may be positioned over the second portion P2 opposite to the first portion P1 of the rotating member 310. The signal may not be applied to the syringe 200 so that the discharge portion 201 may be closed.

After the discharge portion 201 is closed, the nano-string 700 may be cut in the first direction of the first rotating member 310.

Referring to FIG. 14, the cut nano-string 700 may be moved by the first rotating member 310 in the third direction D3 by rotating the first rotating member 310 in the clockwise direction, and the cut nano-string 700 may be removed from the first rotating member and positioned between the second rotating member 320 and the third rotating member 330. Each of the second rotating member 320 and the third rotating member 330 may include a cylindrical drum.

The second rotating member 320 may rotate in the clockwise direction, and the third rotating member 330 may rotate in the counterclockwise direction. A first resin layer 225 may move between the second rotating member 320 and the third rotating member 330 through the second rotating member 320, and a second resin layer 235 may move between the second rotating member 320 and the third rotating member 330 through the third rotating member 330.

The nano-string 700 moved between the second rotating member 320 and the third rotating member 330 may be combined with the first resin layer 225 and the second resin layer 235 through the second rotating member 320 and the third rotating members 330. Therefore, the conductive film 550, which may completely cover the nano-string 700 including the conductive balls 600 movable only in one direction, may be manufactured by using the conductive film manufacturing device 900 illustrated in FIG. 10 based on the method of manufacturing the conductive film according to the exemplary embodiments of the present invention.

The present invention may be applied to various electronic devices having a display device including a conductive film. For example, the present invention may be applied to vehicle-display device, a ship-display device, an aircraft-display device, portable communication devices, display devices for display or for information transfer, a medical-display device, etc The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A device configured to manufacture a conductive film, the device comprising:
a rotating member rotating about an axis extending in a first direction;
a first syringe disposed over a first portion of the rotating member, the first syringe being configured to discharge a first polymer and conductive balls through a discharge portion; and
a second syringe adjacent to the first syringe, the second syringe being configured to discharge a second polymer different than the first polymer,
wherein the rotating member rotates at a first non-zero speed,
wherein the first syringe and the second syringe move at a second non-zero speed in the first direction while a nano-string is discharged through the discharge portion of the first syringe, and move from the first portion of the rotating member toward a second portion opposite to the first portion of the rotating member.

2. The device of claim 1, wherein the first polymer has a first viscosity, and the second polymer has a second viscosity lower than the first viscosity.

3. The device of claim 1, wherein the first syringe is positioned to partially but not completely overlap the second syringe in each of the first direction and in a second direction perpendicular to the first direction.

4. The device of claim 1, wherein an electric field is formed by applying a voltage to the first syringe, and the conductive balls are periodically injected into a nano-fiber while the first polymer is discharged as the nano-fiber by the electric field.

5. The device of claim 4, wherein the nano-fiber surrounds a part of each of the conductive balls.

6. The device of claim 4, wherein the nano-fiber and the conductive balls periodically injected into the nano-fiber form the nano-string that is wound on the rotating member.

7. The device of claim 6, wherein a width of the nano-string where the nano-fiber connecting two adjacent conductive balls among the conductive balls is positioned is smaller than a width of the nano-string where the conductive balls are positioned.

8. The device of claim 6, wherein the second polymer discharged from the second syringe is wound on the rotating member alternately with the nano-string.

9. The device of claim 6, wherein the rotating member rotates in a clockwise direction at the first non-zero speed.

10. The device of claim 9, wherein an interval between the conductive balls included in the nano-string is determined by the first non-zero speed.

11. A device configured to manufacture a conductive film, the device comprising:
- a rotating member rotating about an axis extending in a first direction;
- a first syringe disposed over a first portion of the rotating member, the first syringe being configured to discharge a first polymer and conductive balls; and
- a second syringe adjacent to the first syringe, the second syringe being configured to discharge a second polymer,
- wherein the second syringe is positioned to overlap at least a part of the first syringe in a second direction perpendicular to the first direction, and in a third direction perpendicular to the first and second directions.

12. The device of claim 11, wherein the first syringe is positioned to partially but not completely overlap the second syringe in each of the first, second, and third directions.

* * * * *